United States Patent [19]

Barth

[11] Patent Number: 4,665,610
[45] Date of Patent: May 19, 1987

[54] METHOD OF MAKING A SEMICONDUCTOR TRANSDUCER HAVING MULTIPLE LEVEL DIAPHRAGM STRUCTURE

[75] Inventor: Phillip W. Barth, Palo Alto, Calif.

[73] Assignee: Stanford University, Menlo Park, Calif.

[21] Appl. No.: 725,984

[22] Filed: Apr. 22, 1985

[51] Int. Cl.$^4$ .............................................. H01G 7/00
[52] U.S. Cl. ........................ 29/580; 148/DIG. 159;
357/26; 29/576 C; 29/576 E; 156/644; 73/777
[58] Field of Search .......... 357/26; 29/576 C, 576 E,
29/580; 156/647, 653, 644; 148/DIG. 50, DIG. 26, DIG. 159

[56] References Cited

U.S. PATENT DOCUMENTS 4,332,000 5/1982 Petersen ................................. 357/26
4,588,472 5/1986 Shimizu ............................... 156/647

OTHER PUBLICATIONS

Barth, P. W., "Silicon Sensors Meet Integrated Circuits", IEEE Spectrum, vol. 18, No. 9, Sep. 1981, pp. 33–39.

Primary Examiner—Brian E. Hearn
Assistant Examiner—Kevin McAndrews
Attorney, Agent, or Firm—Flehr, Hohbach, Test, Albritton & Herbert

[57] ABSTRACT

A semiconductor pressure transducer includes a silicon substrate, a recessed portion in a major surface of the substrate, and a multiple level diaphragm overlying the recessed portion. A selectively etchable spacer material is employed when fabricating the diaphragm by forming successive layers of diaphragm material over the spacer material. Holes through the diaphragm are filled with the selectively etchable material thereby allowing the etching of the spacer material. Support posts can be provided in the recessed portion to help support the diaphragm.

22 Claims, 22 Drawing Figures

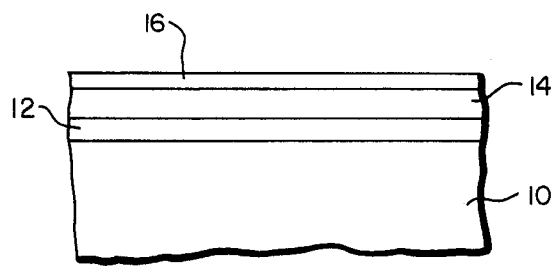
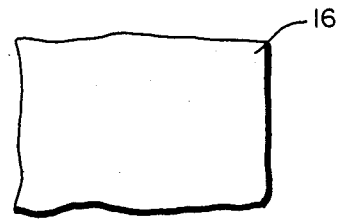
FIG.—1A  FIG.—1B
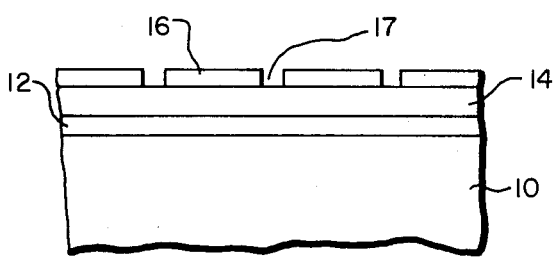
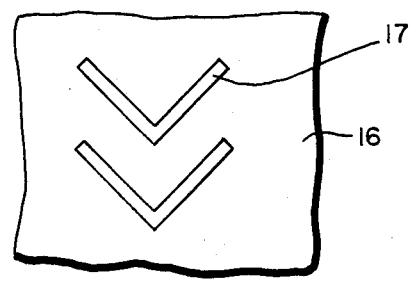
FIG.—2A  FIG.—2B
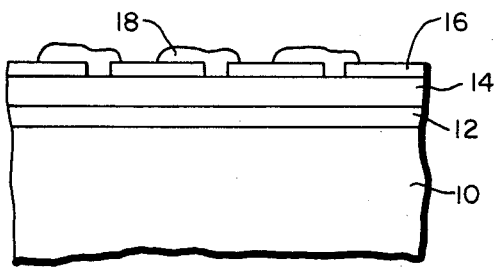
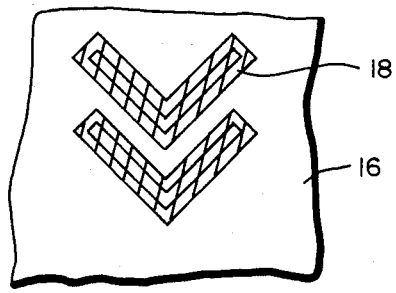
FIG.—3A  FIG.—3B
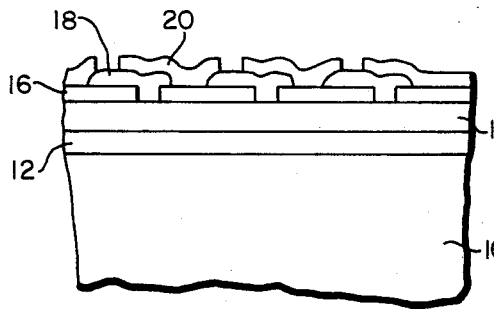
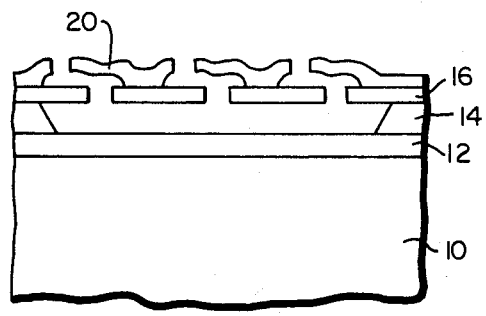
FIG.—4  FIG.—5

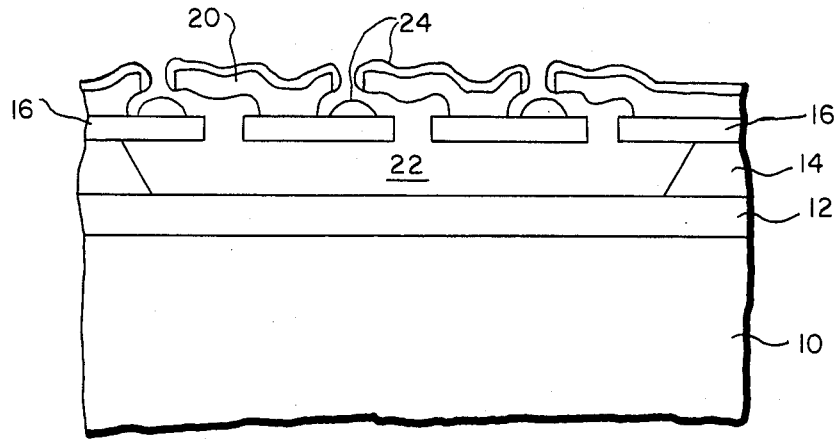
FIG.—6
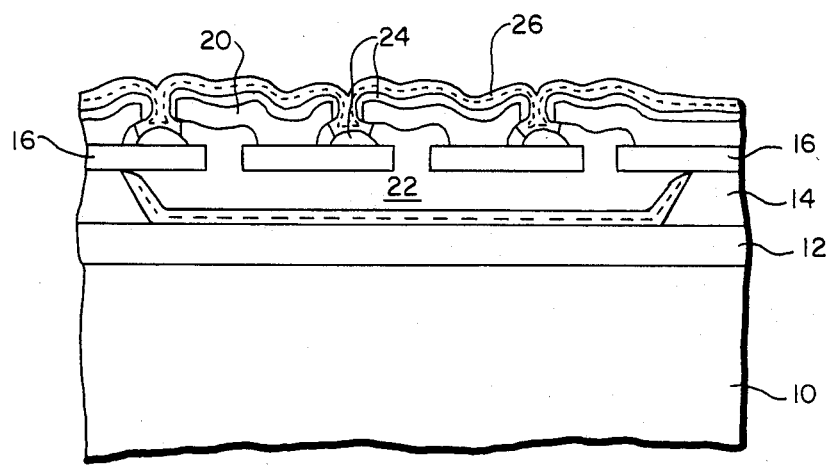
FIG.—7
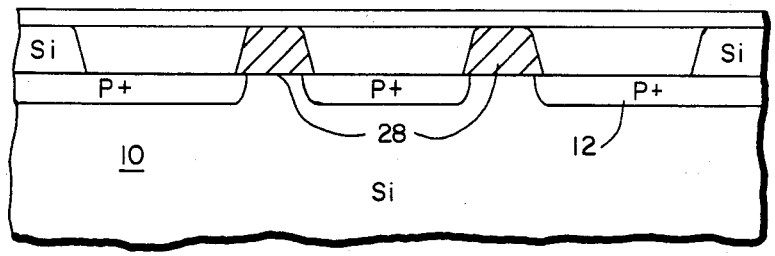
FIG.—8

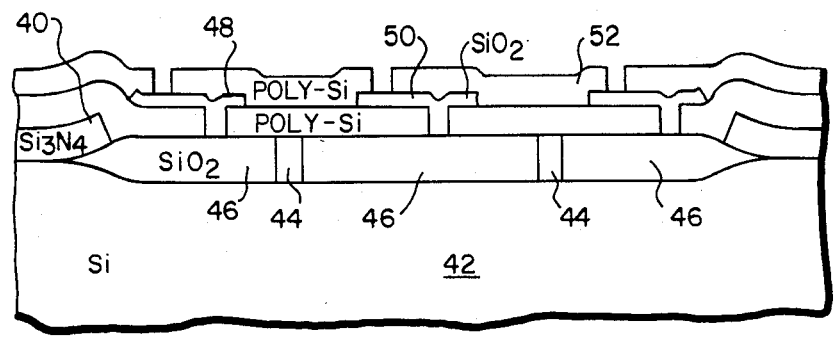
FIG.—17
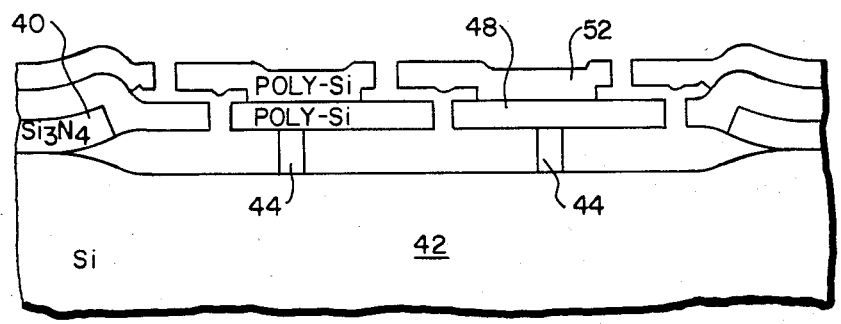
FIG.—18
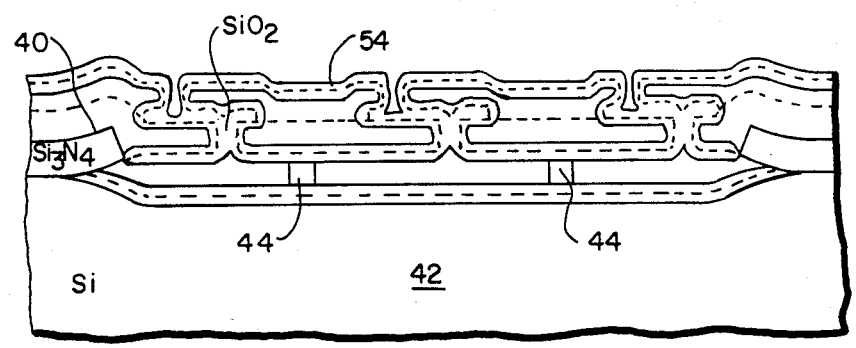
FIG.—19

METHOD OF MAKING A SEMICONDUCTOR TRANSDUCER HAVING MULTIPLE LEVEL DIAPHRAGM STRUCTURE

The U.S. Government has rights in the invention described and claimed herein pursuant to Grant No. P41-RR-01086.

This invention relates generally to semiconductor diaphragm structures useful for transducers, and more particularly this invention relates to a pressure transducer structure having a multiple level diaphragm.

The semiconductor pressure transducer is well known. A typical capacitive transducer places a moving diaphragm (which forms one plate of a parallel plate capacitor) near and parallel to a fixed planar surface (the other plate of the capacitor). As the zero pressure separation of these two surfaces decreases, sensitivity and the signal-to-noise ratio of the transducer increase because the capacitance of the two parallel plates increases relative to the parasitic capacitance and noise of the associated circuitry. However, as the diaphragm flexes with pressure it eventually will bend so far that it touches the fixed plate thereby causing either a short circuit or a large decrease in sensitivity. To prevent this occurrence and thus give a greater dynamic pressure range to the sensor, it is necessary to use a relatively thick diaphragm, typically on the order of 60 micrometers or more, which cannot be fabricated by purely planar techniques. The thick diaphragm also decreases the sensitivity of the sensor. Smaller transducers can use thinner diaphragms, but because signal-to-noise ratio decreases for small transducers this is not a viable approach. Many small transducers could be placed in parallel to provide an adequate signal-to-noise ratio, but this approach is not feasible with conventional backside etching techniques for pressure transducer fabrication because too much silicon area is consumed by the thick silicon collar around each diaphragm.

The fabrication of a silicon transducer including a diaphragm over a shallow cavity is known. Typically, the diaphragm material is deposited over a sacrificial spacer material, and the spacer material is then chemically etched away through small holes at the edge of the diaphragm. The holes can then be sealed either by depositing additional material over the holes or by oxidation of the diaphragm material thus sealing the holes. In the latter case, a layer of silicon oxide grows on both the substrate and the diaphragm thereby filling in the holes at the edge of the diaphragm and creating a sealed cavity. If oxidation is continued after sealing occurs, any remaining oxygen within the sealed cavity is consumed by oxide growth, creating a partial or complete vacuum within the sealed cavity.

Known techniques for fabricating such diaphragms over shallow cavities have two major weaknesses. Extremely long etch times are required to remove the sacrificial spacer, and the diaphragm cannot be electrically insulated from the underlying substrate. The second deficiency is a consequence of the first since any available insulator between the diaphragm and the substrate would be etched away during extremely long etch times to remove the sacrificial spacer. Further, large area diaphragms cannot be fabricated.

Accordingly, an object of the present invention is an improved semiconductor transducer and diaphragm structure.

Another object of the invention is an improved method of fabricating a semiconductor transducer using a sacrificial spacer material or materials.

Yet another object of the invention is a large area transducer having small plate separation and a thin diaphragm for high sensitivity, high signal-to-noise ratio, and wide dynamic range.

Another object of this invention is a method of fabricating a diaphragm over a shallow cavity and which diaphragm can be electrically insulated from an underlying structure, useful for semiconductor transducer structures such as pressure transducers, accelerometers, and bolometers.

A feature of the invention is a multiple level diaphragm.

Another feature of the invention is the optical use of an insulating flange made possible by the multiple level diaphragm.

Another feature of the invention is the optional use of an array of standoff posts for supporting one continuous diaphragm, also made possible by the multiple level diaphragm.

Briefly, in accordance with this invention, a multiple level diaphragm structure is formed over a selectively etchable spacer material on a substrate. Additional spacer material extends through a plurality of bent-path openings in the diaphragm structure whereby the underlying spacer material and the additional spacer material can both be removed by etching through the plurality of openings, forming a shallow underlying cavity whose depth is the same as the thickness of the underlying spacer material. Because the path through an individual bent-path opening in the diaphragm is not a straight line, it is possible to later seal the underlying cavity from the ambient above the diaphragm.

In forming the diaphragm structure, a layer of spacer material is first formed on or defined in the surface of a semiconductor substrate, as an area occupying that area of the substrate which will be occupied by the final diaphragm structure. A first layer of diaphragm material is formed over the spacer material, and a plurality of openings is then formed in the first layer of diaphragm material. Additional spacer material, which may be the same as or different than the original spacer material, is then formed in and around each opening. The additional spacer material extends laterally along the surface of the diaphragm material for a short distance. Then a second layer of diaphragm material, which may be the same as or different than the first layer of diaphragm material, is formed over the first layer of diaphragm material and over the additional areas of spacer material. A plurality of holes is then etched in the second layer of diaphragm material to expose the additional areas of spacer material. The holes in the second layer of diaphragm material must not be directly over the holes in the first layer of diaphragm material in order to perit a sealed cavity to be formed subsequently. A selective etchant is then applied to remove the additional areas of spacer material and the original underlying area of spacer material, in the process creating a cavity beneath the two-level diaphragm structure.

It should be appreciated that this process of fabricating a diaphragm structure can be continued to three or more levels of diaphragm and spacer material. Diaphragms containing more than two levels of material with bent-path openings through the diaphragm have useful applications as fluid filters or as rigid miniature fluid resistors.

The cavity formed beneath the two-level diaphragm discussed above can be sealed by depositing additional material on top of the diaphragm, using techniques such as vacuum evaporation or sputtering. If there are no straight-line paths between holes in the two layers of diaphragm material, all of the deposited material will stick to the diaphragm and none will enter the cavity. Even if some straight-line path exists between holes in the two layers of diaphragm material, sealing is possible as long as the deposited material does not impinge on the diaphragm along that straight-line path. For example, in vacuum evaporation of a material the evaporation source typically is no more than 45 degrees from a vertical axis through the wafer surface, and if any straight-line path through the holes in the two layers of diaphragm material is more than 45 degrees away from this vertical axis then none of the deposited material will enter the underlying cavity.

The cavity can also be sealed by subjecting the diaphragm material to a chemical reaction which changes its dimensions. For example, if both layers of the diaphragm are formed of polycrystalline silicon, and if the diaphragm is subjected to an oxidizing ambient at high temperature, a layer of silicon dioxide glass will grow on all of the diaphragm surfaces, consumimng some of the polycrystalline silicon in the process and causing the thickness of each layer of the diaphragm to grown. If the thickness of the spacer material in the space between layers of diaphragm material was thin compared to the thickness of the layers of diaphragm material, then the growing layers of diaphragm material will meet and close off the bent-path channels, sealing the cavity.

Advantageously, a supporting flange of electrically insulative material can be placed beneath the edges of the multiple level diaphragm, outside the area of the original layer of spacer material before the first layer of diaphragm material is deposited. The flange of insulative material permits the diaphragm to be isolated from the substrate except where connection to the substrate is desired, and so permits capacitive transducer structures to be formed. The use of an insulating supporting flange is possible because etch times for removal of the sacrifical spacer material are much shorter than those in prior art, so that the flange material is not consumed during removal of the space material.

Also advantageously, a plurality of support posts can be formed as plugs within the area of the original layer of spacer material, before the first layer of diaphragm material is deposited, to support the diaphragm structure thereby allowing closer spacing of the diaphragm to the substrate and thus permitting pressure transducers of increased sensitivity and dynamic range to be fabricated. If such support posts are made of insulative material, their use is possible because short etch times for removal of the sacrificial space material permit the supporting posts to remain without being consumed. If the diaphragm itself is made of insulative material, the support posts need not be made of insulative material.

In one group of embodiments the substrate is single crystal silicon, both layers of spacer material are silicon dioxide, and both layers of diaphragm material are polycrystalline silicon. The selective etchant for the silicon dioxide can be hydrofluoric acid. The polycrystalline silicon diaphragm can be positioned on a flange of insulative silicon nitride if desired, and supporting posts of silicon nitride can be left within the cavity if desired. The diaphragm material itself can be conductive and can form one plate of a capacitor. The underlying cavity can be sealed by oxidation of the polycrystalline silicon diaphragm or by deposition of additional material on the diaphragm, or by a combination of deposition and chemical reaction. Additional deposited material for sealing can be either an insulator or a conductor.

In another group of embodiments, the underlying layer of spacer material is either polycrystalline silicon or single-crystal silicon and the additional spacer material is polycrystalline silicon. The diaphragm materials are insulators such as silicon nitride, silicon dioxide, or a combination of the two. The thickness of the bottom layer of spacer material is set by emplacing an etch stop layer such as boron-doped silicon, silicon dioxide, or silicon nitride beneath the sacrificial spacer. The spacer material can be removed by a caustic etchant such as potassium hydroxide in water or an acid etchant such as a mixture of hydrofluoric acid and nitric acid. A supporting flange of either silicon nitride or silicon dioxide can be left after etching of the spacer material, as can supporting posts of either silicon dioxide or silicon nitride. Sealing of the cavity can occur by material deposition, chemical reaction, or a combination of material deposition and chemical reaction. Deposition of a conductive layer is necessary to form the movable plate of a parallel-plate capacitor.

In a third group of embodiments, both layers of spacer material are silicon dioxide, and both layers of diaphragm material are silicon nitride. A flange and supporting posts of silicon nitride can be left in the final structure, and sealing of the cavity can occur by material deposition, or by a combination of the material deposition and chemical reaction. Deposition of a conductive layer is necessary to form the movable plate of a parallel-plate capacitor.

In a fourth group of embodiments, both layers of spacer material are silicon dioxide, either layer of diaphragm material is silicon nitride, and the other layer of diaphragm material is polycrystalline silicon. A flange and supporting posts of silicon nitride can be left in the final structure, and sealing of the cavity can occur by material deposition, chemical reaction, or a combination of the material deposition and chemical reaction. The diaphragm material itself can be conductive.

A fifth group of embodiments is similar to the first and fourth group of embodiments discussed above except that one or more of the polycrystalline silicon layers discussed above is replaced by a metal silicide.

In a sixth group of embodiments, both layers of spacer material are organic polymers such as photoresist and both layers of diaphragm material are metal. Supporting flanges and posts can be silicon dioxide or silicon nitride.

In a seventh group of embodiments, both layers of spacer material are metal and both layers of diaphragm material are metal. Supporting flanges and posts can be silicon dioxide or silicon nitride.

The invention and objects and features thereof will be more readily apparent from the following detailed description and appended claims when taken with the drawings, in which:

FIGS. 1-7 illustrate steps in fabricating a semiconductor pressure transducer in accordance with one embodiment of the present invention.

FIGS. 1B-3B are respective plan views of FIGS. 1A-3A.

FIG. 8 is a section view of an alternative embodiment of the pressure transducer illustrated in FIGS. 1-7.

FIGS. 9–19 illustrate steps in fabricating a pressure transducer in accordance with another embodiment of the invention.

Figure 9:
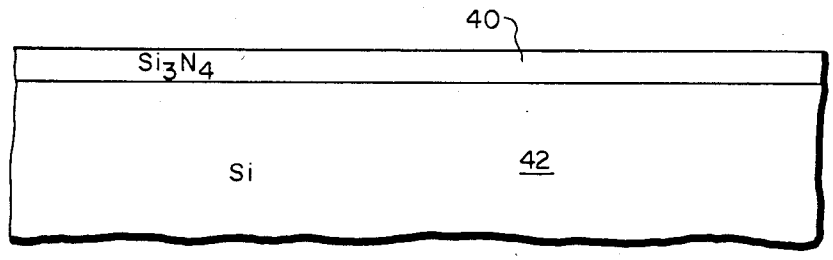

Referring now to the drawings, FIGS. 1–7 illustrate the steps in fabricating a semiconductor transducer having a multiple level structured diaphragm in accordance with one embodiment of the invention. FIG. 1A and FIG. 1B are a section view and a plan view, respectively, of a portion of a semiconductor body in which the transducer will be fabricated. As shown in FIG. 1A the semiconductor body comprises a single crystal silicon wafer 10, a boron doped layer 12, an undoped layer 14, and a surface layer 16 of silicon nitride. The layer 14 can be an epitaxial silicon layer grown on the surface of the boron doped layer 12. Alternatively, the boron doped level 12 can be formed by implantation of boron ions through the surface layer 14. As will be described further hereinbelow, the boron doped layer 12 will function as an etch stop layer.

FIGS. 2A and 2B are a section view and plan view, respectively, of the semiconductor body of FIGS. 1A and 1B in which openings 17 are etched through the silicon nitride layer 16. As shown in FIG. 2B the openings are aligned at right angles and will define the diaphragm portion of the transducer structure, as taught in U.S. Pat. No. 4,332,000. It will be appreciated that openings having configurations other than the chevron pattern can be employed.

Thereafter, as shown in the section view and plan view of FIGS. 3A and 3B, a layer of polycrystalline silicon is deposited on the top surface and then selectively etched whereby polycrystalline silicon plugs 18 remain in the openings etched through the silicon nitride layer 16. Next, as shown in FIG. 4, a second layer of an insulator such as silicon nitride or silicon dioxide is deposited on the top surface of the structure and then selectively etched to leave the portions 20 in integral contact with the underlying insulator layer 16 and partially covering the silicon plugs 18.

As shown in FIG. 5, the silicon plugs 18 and the underlying silicon layer 14 are removed by a preferential etchant. Preferably, a caustic etchant such as potassium hydroxide is employed because such an etchant has a lower etch rate for silicon dioxide and silicon nitride than acid etchants. An acid etchant can be used, but if the spacer material is single crystal silicon, then acid would present more difficulties than the use of caustic etchants. If the spacer material is polycrystalline silicon, use of acid etchants present less difficulty. In either case, the result of this etching step is an insulating multiple level diaphragm, suspended over a shallow cavity 22, as shown in FIG. 5.

If it is desired to seal the cavity 22, a layer 24 of polycrystalline silicon can be deposited on the top surface of the structure as shown by layer 24 in FIG. 6. Thereafter, the silicon layer 24 and the silicon in the cavity 22 are thermally oxidized with the resulting silicon oxide 26 sealing the cavity 22, as shown in FIG. 7. Alternatively, a layer of metal can be deposited on the surface to seal the cavity 22.

As shown in FIG. 8 in accordance with one feature of the invention, support posts 28 can be formed within the cavity 22 to support the multiple level diaphragm shown generally at 31. The posts 28 are formed prior to the deposition of the silicon nitride layers 16 as shown in FIG. 1A by the selective oxidation of the silicon surface layer 14 using the LOCOS oxidation technique.

FIGS. 9–19 are section views illustrating the steps in fabricating another embodiment of the invention in which the diaphragm is made of a conductive material.

Figure 10:
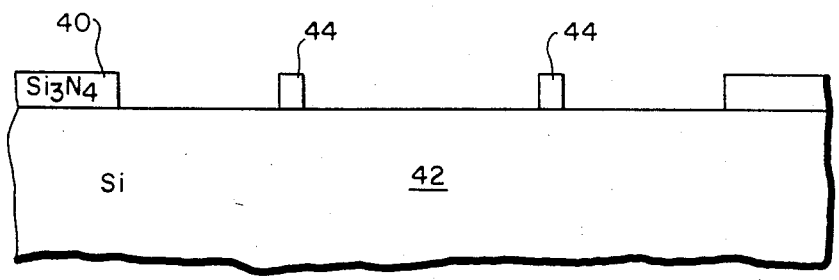

Referring to FIG. 9, a silicon nitride layer 40 is formed on the surface of a single crystal silicon substrate 42. Thereafter, as shown in FIG. 10 the silicon nitride layer is selectively etched to expose the surface of the silicon substrate while leaving support posts 44. A flange of silicon nitride is left around the edge of the diaphragm which will later support the edge of the multiple level diaphragm structure.

Figure 11:
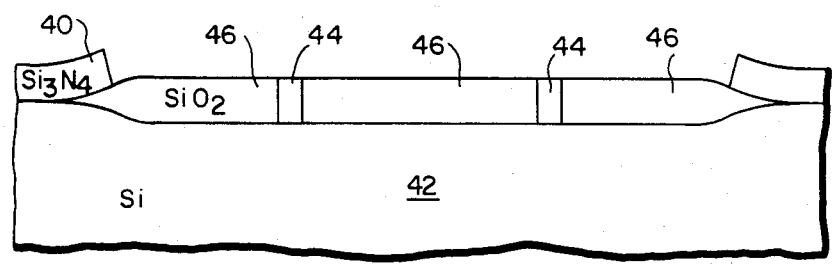
Figure 12:
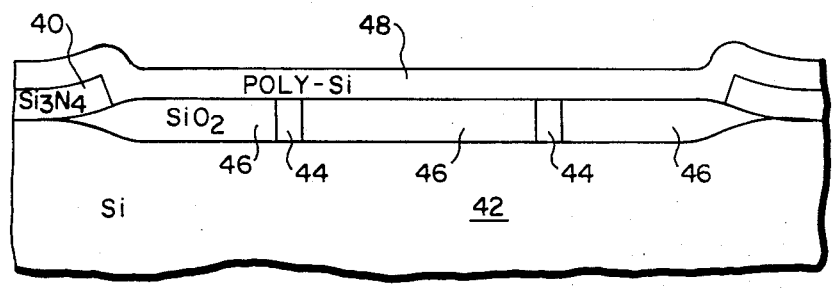
Figure 13:
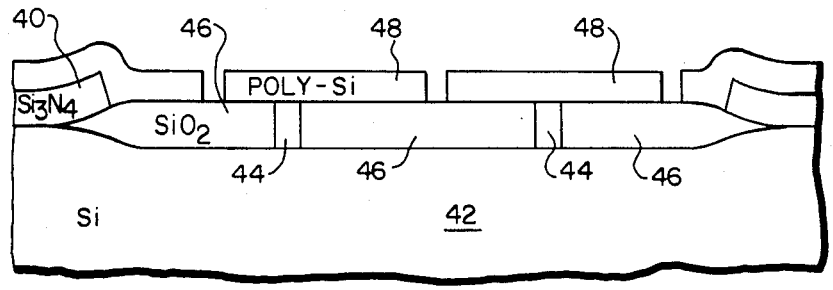

The exposed surface of the silicon substrate is then thermally oxidized to form a first layer of silicon dioxide layer 46 as shown schematically in FIG. 11. It will be appreciated that the edges of the posts will have the typical "Bird's Beak Effect" which is characteristic of local oxidization of silicon (i.e. LOCOS). Thereafter, as shown in FIG. 12 a first polycrystalline silicon layer 48 is formed over the silicon dioxide 46, and openings are etched through the polysilicon layer 48 to expose limited surface portions of the silicon dioxide layer 46 as shown in FIG. 13.

Figure 14:
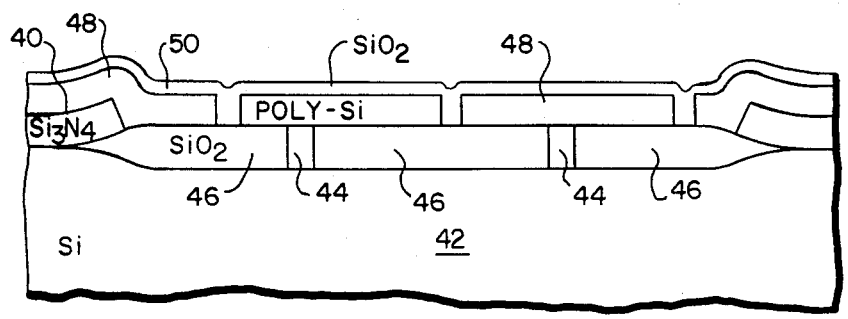
Figure 15:
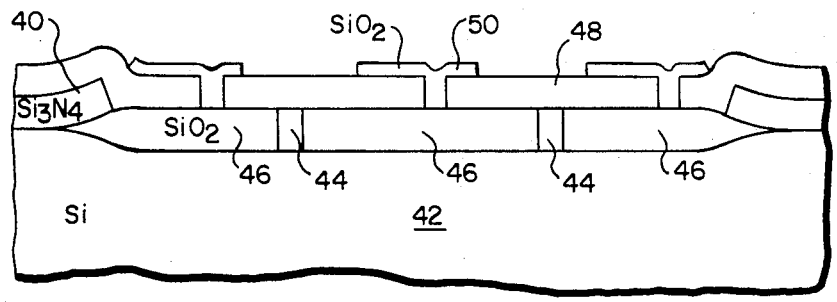

As shown in FIG. 14, a second layer of silicon dioxide 50 is then deposited or thermally grown on the first polysilicon layer 48 and the exposed surface portions of the first silicon dioxide 46. Thereafter, as shown in FIG. 15 the second silicon dioxide layer 50 is etched to expose most of the polysilicon surface 48 with plugs of silicon oxide remaining in the holes previously etched through the polysilicon 48. These silicon oxide plugs will form a portion of the sacrificial spacer during the later cavity etching.

Figure 16:
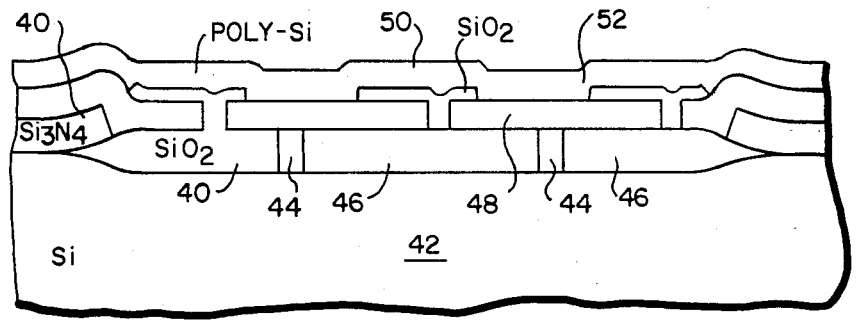

As shown in FIG. 16, a second layer of polycrystalline silicon 52 is formed over the top surface of the structure, and as shown in FIG. 17 the second polysilicon layer 52 is then selectively etched to expose the silicon oxide plugs 50. Thereafter, using a hydrofluoric acid etchant, the sacrificial oxide spacers 50 and 46 are removed. The etching begins at the holes in the second polysilicon layer and goes laterally into the second oxide spacer between the two polysilicon layers, through the first polysilicon layer, and then into the first oxide layer 46. When the oxide spacers are completely etched away as shown in FIG. 18, the remaining structure is a multiple level diaphragm over a shallow cavity 60 supported at the edges by an insulating border of silicon nitride 40 and by the silicon nitride posts 44.

If a sealed cavity is desired, then the structure is thermally oxidized as shown in FIG. 19 with the silicon oxide 54 grown on the surface of the exposed silicon sealing the openings created by etching the silicon oxide spacer material. It will be appreciated that the final cavity sealing step is not necessary in some applications. For example, if a capacitive microphone is desired it can be fabricated without sealing the cavity. The frequency response of the microphone will be determined by the bleed rate of air through the holes in the multiple level diaphragm. Similarly, accelerometer structures using air bleeding for viscous damping are possible.

There has been described a new and improved semiconductor transducer structure employing a multiple level diaphragm which is readily fabricated using conventional semiconductor processing. While the invention has been described with reference to specific embodiments, the description is illustrative of the invention and is not to be construed as limiting the invention. For example, if the semiconductor substrate is silicon, the various layers, plugs, flange and posts can be selected from the group of materials consisting of silicon, polysilicon, silicon dioxide, silicon nitride, metal silicide, polymer, and metal as follows:

first layer: silicon, polysilicon, silicon dioxide, polymer, metal
second layer: polysilicon, silicon dioxide, silicon nitride, polymer, metal
plugs: polysilicon, silicon dioxide, polymer, metal
third layer: polysilicon, silicon dioxide, silicon nitride, metal silicide, polymer, metal
flange: silicon, polysilicon, silicon dioxide, silicon nitride, metal silicide, polymer, metal
posts: silicon, polysilicon, silicon dioxide, silicon nitride, metal silicide, polymer, metal In addition, the multiple level diaphragm can be accessed from both sides by etching the substrate material beneath the diaphragm.

Thus various modifications and applications may occur to those skilled in the art without departing from the true spirit and scope of the invention as defined by the appended claims.

What is claimed is:

1. A method of fabricating a semiconductor transducer having a multiple level diaphragm structure comprising the steps of
   providing a semiconductor substrate,
   forming a first layer of selectively etchable material on a surface of said substrate,
   forming a second layer of a second material over said layer of selectively etchable material,
   forming openings through said second layer and exposing said selectively etchable material,
   forming additional selectively etchable material over limited positions of said first layer and in said openings as plugs having laterally extending portions,
   forming a third layer of a third material over said second layer and and said additional selectively etchable material,
   forming openings through said third layer and exposing said additional selectively etchable material, and
   applying an etchant to remove said selectively etchable material thereby forming a multiple level diaphragm including said second and third layers of materials.

2. The method as defined by claim 1 wherein said openings through said second layer are offset from said openings through said third layer.

3. The method as defined by claim 2 and further including the step of forming an electrically insulative material on said surface of said substrate surrounding said layer of selectively etchable material prior to forming said first layer of second material, wherein the diaphragm structure is anchored to said insulative material.

4. The method as defined by claim 3 and further including the step of forming a plurality of support posts on said surface of said substrate, said support posts being positioned within said selectively etchable material.

5. The method as defined by claim 4 wherein said second and third layers are polycrystalline silicon and further including the step of sealing said diaphragm by oxidizing said polycrystalline silicon.

6. The method as defined by claim 1 and further including the step of forming an electrically insulative flange material on said surface of said substrate surrounding said layer of selectively etchable material prior to forming said first layer of second material, wherein the final diaphragm structure is anchored to said insulative material.

7. The method as defined by claim 6 and further including the step of forming a plurality of support posts on said surface of said substrate, said support posts being positioned within said selectively etchable material.

8. The method as defined by claim 7 wherein said substrate is silicon and said layers, said plugs, said flange material, and said posts are selected from the group consisting of (A) silicon, (B) polycrystalline silicon, (C) silicon dioxide, (D) silicon nitride, (E) metal silicide, (F) polymer, and (G) metal as follows:
   first layer: (A), (B), (C), (F), and (G)
   second layer: (B), (C), (D), (E), (F), and (G)
   plugs: (B), (C), (F), and (G)
   third layer: (B), (C), (D), (E), (F), and (G)
   flange material: (A), (B), (C), (D), (E), (F), and (G)
   posts: (A), (B), (C), (D), (E), (F), and (G).

9. The method as defined by claim 1 and further including the step of forming a plurality of support posts on said surface of said substrate, said support posts being positioned within said selectively etchable material.

10. The method as defined by claim 1 and further including the step of sealing said diaphragm.

11. The method as defined by claim 1 wherein said substrate is silicon and said selectively etchable material is undoped silicon, said layer of selectively etchable material overlying a doped layer of silicon in said substrate.

12. The method as defined by claim 11 wherein said layer of selectively etchable material is formed by vapor deposition.

13. The method as defined by claim 11 wherein said doped layer of silicon is formed by ion implantation.

14. The method as defined by claim 11 and further including the step of forming a plurality of support posts within the area of said selectively etchable material.

15. The method as defined by claim 11 and further including the step of sealing said diaphragm.

16. The method as defined by claim 1 wherein said substrate is silicon, said selectively etchable material is silicon dioxide, and said material in said second and third layers is polycrystalline silicon.

17. The method as defined by claim 16 in which the thickness of said laterally extensive portions of said plugs is less than the thickness of said first layer and in which the thickness of the polycrystalline silicon in said second and third layers is great enough to permit a thermally grown layer of silicon dioxide to form and fill the void left by etching of said laterally extensive portions of said plugs, said cavity formed by etching being sealed by oxidation of the polycrystalline silicon of said second and third layers.

18. The method as defined by claim 16 in which said cavity formed by etching is sealed by deposition of additional material in said holes formed in said third layer.

19. The method as defined by claim 1 in which some line-of-sight view may exist between said holes in said third layer and said holes in said second layer, but in which said view through said holes is small enough to permit sealing of said cavity by deposition of additional material in said holes in said third layer.

20. The method as defined by claim 1 in which some line-of-sight view may exist between said holes in said third layer and said holes in said second layer and in which there is no need to seal said cavity for a specific application.

21. The method as defined by claim 1 wherein said substrate is silicon, said material in said first layer is silicon, said plugs are polycrystalline silicon, said material in said second layer is silicon nitride, and said material in said third layer is selected from silicon nitride and silicon dioxide.

22. The method as defined by claim 1 and further including the step of removing substrate material beneath said diaphragm thereby exposing said diaphragm.

* * * * *